United States Patent
Narushima et al.

(10) Patent No.: US 11,984,319 B2
(45) Date of Patent: May 14, 2024

(54) SUBSTRATE PROCESSING METHOD AND FILM FORMING SYSTEM

(71) Applicant: TOKYO ELECTRON LIMITED, Tokyo (JP)

(72) Inventors: Kensaku Narushima, Nirasaki (JP); Nagayasu Hiramatsu, Hillsboro, OR (US); Takanobu Hotta, Nirasaki (JP); Atsushi Matsumoto, Nirasaki (JP); Masato Araki, Nirasaki (JP); Hideaki Yamasaki, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 238 days.

(21) Appl. No.: 16/783,530

(22) Filed: Feb. 6, 2020

(65) Prior Publication Data

US 2020/0258747 A1 Aug. 13, 2020

(30) Foreign Application Priority Data

Feb. 8, 2019 (JP) .................................. 2019-022087

(51) Int. Cl.
| | |
|---|---|
| *H01L 21/285* | (2006.01) |
| *C09K 13/08* | (2006.01) |
| *C23C 16/06* | (2006.01) |
| *C23C 16/455* | (2006.01) |
| *C23C 16/46* | (2006.01) |

(Continued)

(52) U.S. Cl.
CPC ........ *H01L 21/28556* (2013.01); *C09K 13/08* (2013.01); *C23C 16/06* (2013.01); *C23C 16/45525* (2013.01); *C23C 16/46* (2013.01); *H01L 21/30604* (2013.01);
(Continued)

(58) Field of Classification Search
CPC ............. H01L 21/28556; H01L 21/324; H01L 21/30604; H01L 21/67063; C09K 13/08; C23C 16/006; C23C 16/45525; C23C 16/46
See application file for complete search history.

(56) References Cited

U.S. PATENT DOCUMENTS

| | | | | |
|---|---|---|---|---|
| 4,902,645 | A | * 2/1990 | Ohba | ................ H01L 21/76879 438/625 |
| 5,431,773 | A | * 7/1995 | Ikeda | ...................... H01L 28/40 438/722 |

(Continued)

FOREIGN PATENT DOCUMENTS

| | | |
|---|---|---|
| JP | 63153273 A | 6/1988 |
| JP | 2007-115797 A | 5/2007 |

(Continued)

*Primary Examiner* — Dale E Page
*Assistant Examiner* — Quovaunda Jefferson
(74) *Attorney, Agent, or Firm* — Nath, Goldberg & Meyer; Jerald L. Meyer; Tanya E. Harkins (57) ABSTRACT

There is provided a method of processing a substrate, the method including: providing the substrate on which a natural oxide film is formed; performing a pre-processing on the substrate such that the natural oxide film formed on the substrate is removed; and directly forming a tungsten film on the substrate by heating a stage on which the substrate is mounted to a predetermined temperature and supplying a tungsten chloride gas and a reduction gas to the substrate which has been subjected to the pre-processing.

16 Claims, 7 Drawing Sheets

(51) Int. Cl.
  *H01L 21/306* (2006.01)
  *H01L 21/3213* (2006.01)
  *H01L 21/324* (2006.01)
  *H01L 21/67* (2006.01)

(52) U.S. Cl.
  CPC ...... *H01L 21/32133* (2013.01); *H01L 21/324* (2013.01); *H01L 21/67063* (2013.01)

(56) References Cited

U.S. PATENT DOCUMENTS

| | | | | |
|---|---|---|---|---|
| 6,171,641 | B1* | 1/2001 | Okamoto | H01L 21/6838 427/8 |
| 8,440,568 | B2* | 5/2013 | Ugajin | H01L 21/3065 438/719 |
| 2012/0164830 | A1* | 6/2012 | Lee | H01L 27/10855 438/675 |
| 2013/0323859 | A1* | 12/2013 | Chen | H01J 37/32981 438/7 |
| 2015/0279735 | A1* | 10/2015 | Hotta | H01L 21/28556 438/656 |
| 2015/0325475 | A1* | 11/2015 | Bamnolker | C23C 16/045 438/680 |
| 2016/0322229 | A1* | 11/2016 | Ganguli | H01L 21/76843 |
| 2017/0294319 | A1* | 10/2017 | Ogiwara | H01L 21/67069 |

FOREIGN PATENT DOCUMENTS

| | | |
|---|---|---|
| JP | 2010-245512 A | 10/2010 |
| JP | 2015-190020 A | 11/2015 |
| JP | 2015-193908 A | 11/2015 |
| KR | 1020100105398 A | 9/2010 |
| KR | 1020150112863 A | 10/2015 |
| KR | 1020160094310 A | 8/2016 |

\* cited by examiner

SUBSTRATE PROCESSING METHOD AND FILM FORMING SYSTEM

CROSS-REFERENCE TO RELATED APPLICATION

This application is based upon and claims the benefit of priority from Japanese Patent Application No. 2019-022087, filed on Feb. 8, 2019, the entire contents of which are incorporated herein by reference.

TECHNICAL FIELD

The present disclosure relates to a substrate processing method and a film forming system.

BACKGROUND

There is known a method of forming a tungsten film on a substrate.

Patent document 1 discloses a tungsten film forming method which improves the formation rate of a tungsten film by using a TiN film or a TiSiN film as an underlying film.

PRIOR ART DOCUMENT

Patent Documents

Patent Document 1: Japanese Laid-Open Patent Publication No. 2015-193908 A

SUMMARY

According to an embodiment of the present disclosure, there is provided a method of processing a substrate, the method including: providing the substrate on which a natural oxide film is formed; performing a pre-processing on the substrate such that the natural oxide film formed on the substrate is removed; and directly forming a tungsten film on the substrate by heating a stage on which the substrate is mounted to a predetermined temperature and supplying a tungsten chloride gas and a reduction gas to the substrate which has been subjected to the pre-processing.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the drawings, there may be a case where the same components are designated by like reference numerals with the repeated descriptions thereof omitted. In the following detailed description, numerous specific details are set forth in the named order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

<Cluster System>

Figure 1:
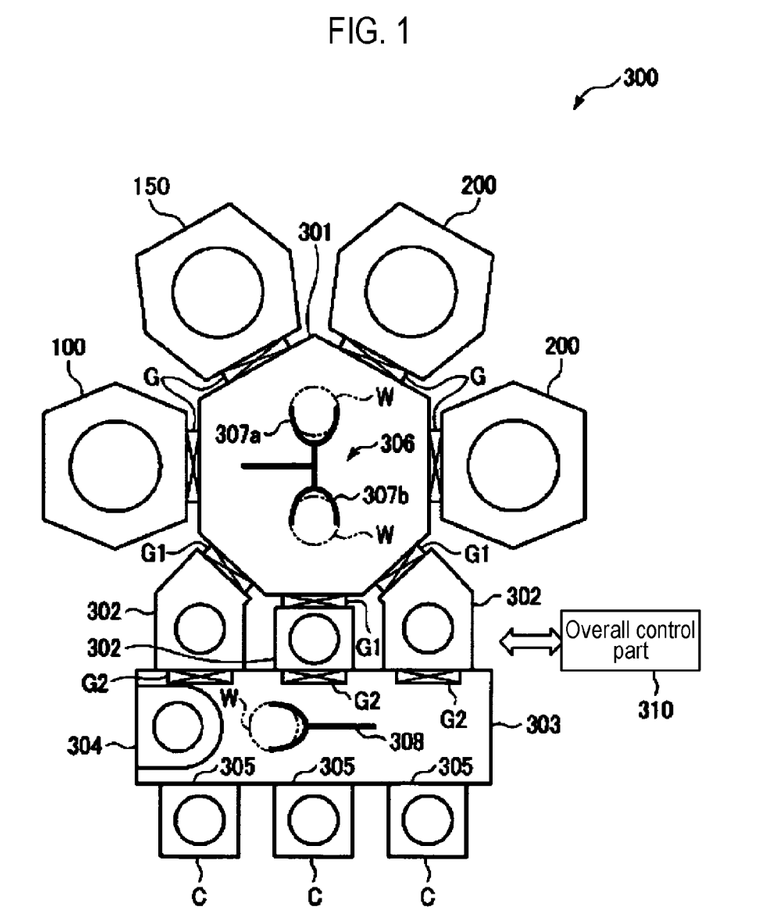
FIG. 1 is a configuration view of a cluster system according to an embodiment.

A cluster system (a film forming system) 300 according to the embodiment will be described with reference to FIG. 1. FIG. 1 is a configuration view of the cluster system 300 according to the embodiment. The cluster system 300 is an apparatus which performs an oxide film removal process on a substrate W such as a wafer, and then performs a metal film forming process on the substrate W which has been subjected to the oxide film removal process.

The cluster system 300 includes one or more processing apparatuses. In an example illustrated in FIG. 1, the cluster system 300 includes a first pre-processing apparatus 100, a second pre-processing apparatus 150, and metal film forming apparatuses 200. These apparatuses are coupled to four wall portions of a vacuum transfer chamber 301 having a heptangular planar shape through respective gate valves G. The interior of the vacuum transfer chamber 301 is exhausted by a vacuum pump to be maintained at a predetermined degree of vacuum.

The first pre-processing apparatus 100 and the second pre-processing apparatus 150 are apparatuses for performing the oxide film removal process as a pre-treatment on the substrate W. A trench 403 (see FIG. 4A described below) is formed in a predetermined pattern on the substrate W. Further, a natural oxide film 404 (see FIG. 4A described below) is formed on a front surface of a silicon portion in the bottom of the trench 403. In the oxide film removal process, the natural oxide film 404 formed on the front surface of the silicon portion in the bottom of the trench 403 of the substrate W is removed. Specifically, the first pre-processing apparatus 100 performs a chemical oxide removal (COR) process of removing the natural oxide film 404. The second pre-processing apparatus 150 performs a post heat treatment (PHT) of removing a reaction product 405 generated by the COR process.

The COR process used herein is a process of supplying a processing gas into a chamber of the first pre-processing apparatus 100 to etch a silicon oxide (the natural oxide film 404) formed on the substrate W. For example, a hydrogen fluoride gas (HF) as a fluorine-containing gas, an ammonia gas ($NH_3$) as a nitrogen-containing gas, an argon gas (Ar), or a nitrogen gas ($N_2$) is supplied as the processing gas.

Thus, the substrate W is exposed to a mixture gas of the fluorine-containing gas and the nitrogen-containing gas. The silicon oxide of the substrate W reacts with the hydrogen fluoride gas and the ammonia gas, thereby generating ammonium fluorosilicate (($NH_4$)$_2$$SiF_6$: AFS) as a reaction product (byproduct). Further, the reaction product 405 (see FIG. 4B described below) generated by the COR process is deposited on the substrate W.

The PHT process used herein is a process of heating the substrate W to remove the reaction product 405 from the substrate W by sublimation.

The metal film forming apparatus 200 is an apparatus for performing the metal film forming process. In the metal film forming process, a tungsten film 406 (see FIG. 4D described below) is formed on the silicon portion in the bottom of the trench 403 of the substrate W. For example, the metal film forming apparatus 200 includes a chemical vapor deposition (CVD)-based apparatus, an atomic layer deposition (ALD)-based apparatus, or the like.

Further, three load-lock chambers 302 are connected to the three remaining wall portions of the vacuum transfer chamber 301 through respective gate valves G1. An atmospheric-side transfer chamber 303 is provided at a side of the load-lock chambers 302 opposite to the vacuum transfer chamber 301. The three load-lock chambers 302 are coupled to the atmospheric-side transfer chamber 303 through respective gate valves G2. The load-lock chambers 302 are configured such that the internal pressure thereof is switched between atmospheric pressure and a vacuum atmosphere when the substrate W is transferred between the atmospheric-side transfer chamber 303 and the vacuum transfer chamber 301.

Three carrier attachment ports 305 to which carriers (FOUP, etc.) C for receiving the substrates W are respectively attached, are arranged on a wall portion of the atmospheric-side transfer chamber 303 opposite the load-lock chambers 302. Further, an alignment chamber 304 for aligning the substrate W is provided on a sidewall of the atmospheric-side transfer chamber 303. In the interior of the atmospheric-side transfer chamber 303, a down-flow of clean air is formed.

A transfer mechanism 306 is provided inside the vacuum transfer chamber 301. The transfer mechanism 306 transfers the substrate W between the first pre-processing apparatus 100, the second pre-processing apparatus 150, the metal film forming apparatus 200, and the load-lock chambers 302. The transfer mechanism 306 includes two transfer arms 307a and 307b configured to be movable independently of each other.

A transfer mechanism 308 is provided inside the atmospheric-side transfer chamber 303. The transfer mechanism 308 is configured to transfer the substrate W between the carriers C, the load-lock chambers 302, and the alignment chamber 304.

The cluster system 300 includes an overall control part 310. The overall control part 310 includes a main controller having a CPU (a computer) for controlling respective components of the first pre-processing apparatus 100, the second pre-processing apparatus 150 and the metal film forming apparatus 200, an exhaust mechanism or the transfer mechanism 306 of the vacuum transfer chamber 301, an exhaust mechanism or a gas supply mechanism of each load-lock chamber 302, the transfer mechanism 308 of the atmospheric-side transfer chamber 303, driving systems of the gate valve G, G1, and G2, and the like, an input device (a keyboard, a mouse, etc.), an output device (a printer, etc.), a display device (a display, etc.), and a memory device (a memory medium). Based on a process recipe stored in a memory medium embedded in the memory device or a memory medium set in the memory device, the main controller of the overall control part 310 controls the cluster system 300 to execute a predetermined operation. Further, the overall control part 310 may be a higher-level control part of a controller of each unit, such as a control device 6 (see FIG. 2) described below.

Hereinafter, the operation of the cluster system 300 configured as above will be described. The following process operation is executed based on the process recipe stored in the memory medium of the overall control part 310.

First, the overall control part 310 controls the transfer mechanism 308 to pick up the substrate W from one carrier C connected to the atmospheric-side transfer chamber 303 and transfer the same to the atmospheric-side transfer chamber 303. The overall control part 310 opens the gate valve G2 disposed in one load-lock chamber 302 and loads the substrate W held by the transfer mechanism 308 into the load-lock chamber 302. After the transfer arm of the transfer mechanism 308 is withdrawn and moved into the atmospheric-side transfer chamber 303, the overall control part 310 closes the gate valve G2 and evacuates the interior of the load-lock chamber 302. Further, after the substrate W is picked up from the carrier C and before the substrate W is loaded into the load-lock chamber 302, an alignment process is performed on the substrate W in the alignment chamber 304.

At the time at which the interior of the load-lock chamber 302 is maintained at a predetermined degree of vacuum, the overall control part 310 opens the gate valve G1 of the load-lock chamber 302, and controls the transfer mechanism 306 to pick up the substrate W from the load-lock chamber 302 and load the same into the vacuum transfer chamber 301. After the transfer arm of the transfer mechanism 306 is withdrawn and moved into the vacuum transfer chamber 301, the overall control part 310 closes the gate valve G1.

The overall control part 310 opens the gate valve G of the first pre-processing apparatus 100 and loads the substrate W held by the transfer mechanism 306 into the first pre-processing apparatus 100. After the transfer arm of the transfer mechanism 306 is withdrawn and moved into the vacuum transfer chamber 301, the overall control part 310 closes the gate valve G and controls the first pre-processing apparatus 100 to perform the COR process.

After the COR process is completed, the overall control part 310 opens the gate valve G of the first pre-processing apparatus 100, and controls the transfer mechanism 306 to pick up the substrate W from the first pre-processing apparatus 100 and transfer the same to the vacuum transfer chamber 301. After the transfer arm of the transfer mechanism 306 is withdrawn and moved into the vacuum transfer chamber 301, the overall control part 310 closes the gate valve G of the first pre-processing apparatus 100.

The overall control part 310 opens the gate valve G of the second pre-processing apparatus 150 and loads the substrate W held by the transfer mechanism 306 into the second pre-processing apparatus 150. After the transfer arm of the transfer mechanism 306 is withdrawn and moved into the vacuum transfer chamber 301, the overall control part 310 closes the gate valve G and controls the second pre-processing apparatus 150 to perform the PHT process.

After the PHT process is completed, the overall control part 310 opens the gate valve G of the second pre-processing apparatus 150, and controls the transfer mechanism 306 to pick up the substrate W from the second pre-processing apparatus 150 and transfer the same to the vacuum transfer chamber 301. After the transfer arm of the transfer mechanism 306 is withdrawn and moved into the vacuum transfer chamber 301, the overall control part 310 closes the gate valve G of the second pre-processing apparatus 150.

The overall control part 310 opens the gate valve G of the metal film forming apparatus 200 and loads the substrate W held by the transfer mechanism 306 into the metal film forming apparatus 200. After the transfer arm of the transfer mechanism 306 is withdrawn and moved into the vacuum transfer chamber 301, the overall control part 310 closes the gate valve G and controls the metal film forming apparatus 200 to perform the metal film forming process. In the metal film forming process, the formation of the tungsten film 406 is performed. As a result, the tungsten film 406 as a metal film may be selectively formed from the bottom of the trench 403, starting from silicon in the bottom of the trench 403.

After the metal film forming process is completed, the overall control part 310 opens the gate valve G of the metal film forming apparatus 200, and controls the transfer mechanism 306 to pick up the substrate W from the metal film forming apparatus 200 and transfer the same to the vacuum transfer chamber 301. After the transfer arm of the transfer mechanism 306 is withdrawn and moved into the vacuum transfer chamber 301, the overall control part 310 closes the gate valve G of the metal film forming apparatus 200.

The overall control part 310 opens the gate valve G1 of one load-lock chamber 302 and loads the substrate W held by the transfer mechanism 306 into the load-lock chamber 302. After the transfer arm of the transfer mechanism 306 is withdrawn and moved into the vacuum transfer chamber 301, the overall control part 310 closes the gate valve G1 and switches the internal atmosphere of the load-lock chamber 302 to an atmospheric environment.

At the time at which the interior of the load-lock chamber 302 becomes a predetermined atmospheric environment, the overall control part 310 opens the gate valve G2 of the load-lock chamber 302, and controls the transfer mechanism 308 to pick up the substrate W from the load-lock chamber 302 and transfer the same to the atmospheric-side transfer chamber 303. After the transfer arm of the transfer mechanism 308 is withdrawn and moved into the atmospheric-side transfer chamber 303, the overall control part 310 closes the gate valve G2 of the load-lock chamber 302. The overall control part 310 returns the substrate W held by the transfer mechanism 308 to the carrier C.

As described above, according to the cluster system 300 of the embodiment, the substrate W is subjected to the oxide film removal process as a pre-treatment in the first pre-processing apparatus 100 and the second pre-processing apparatus 150, and subsequently, transferred from the second pre-processing apparatus 150 to the metal film forming apparatus 200 while maintaining a vacuum atmosphere (without breaking a vacuum state). The substrate W, which has been subjected to the oxide film removal process, is subjected to the metal film forming process in the metal film forming apparatus 200. Thus, it is possible to form the tungsten film 406 having a low resistance on the substrate W.

<Metal Film Forming Apparatus 200>

Figure 2:
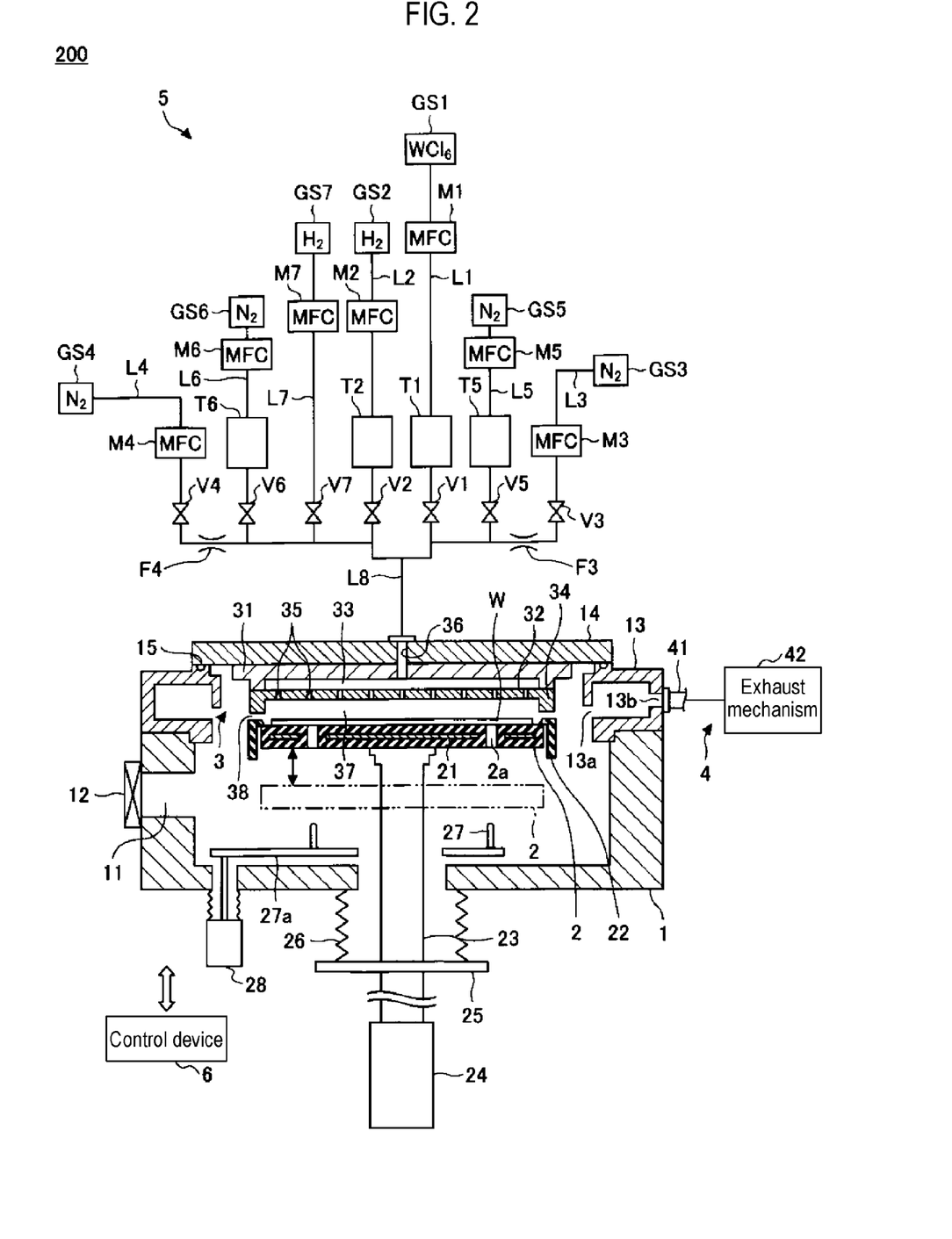
FIG. 2 is a schematic cross-sectional view illustrating an example of a metal film forming apparatus included in the cluster system according to the embodiment.

Next, an example of the configuration of the metal film forming apparatus 200 will be described with reference to FIG. 2. FIG. 2 is a schematic cross-sectional view illustrating an example of the metal film forming apparatus 200 included in the cluster system 300 according to the embodiment.

As illustrated in FIG. 2, the metal film forming apparatus 200 includes a processing container 1, a substrate stage 2, a shower head 3, an exhaust part 4, a processing gas supply mechanism 5, and a control device 6.

The processing container 1 is made of a metal such as aluminum and has a substantially cylindrical shape. A loading/unloading port 11 through which the substrate W is transferred is formed in a sidewall of the processing container 1. The loading/unloading port 11 is opened or closed by a gate valve 12. An annular exhaust duct 13 having a rectangular cross-section is provided on a main body of the processing container 1. The exhaust duct 13 has a slit 13a formed along an inner peripheral surface thereof. Further, an exhaust port 13b is formed in an outer wall of the exhaust duct 13. A ceiling wall 14 is provided on an upper surface of the exhaust duct 13 so as to block an upper opening of the processing container 1. A gap between the ceiling wall 14 and the exhaust duct 13 is hermetically sealed by a seal ring 15.

The substrate stage 2 supports the substrate W in a horizontal posture inside the processing container 1. The substrate stage 2 is formed in a disk shape having a size corresponding to the substrate W, and is supported by a support member 23. The substrate stage 2 is made of a ceramic material such as aluminum nitride (AlN), or a metal material such as an aluminum or nickel-based alloy. The substrate stage 2 includes a heater 21 provided therein so as to heat the substrate W. The heater 21 generates heat based on power supplied from a heater power supply (not shown). The output of the heater 21 is controlled by a temperature signal of a thermocouple (not shown) provided near a substrate mounting surface in the upper surface of the substrate stage 2. Thus, the substrate W is controlled to have a predetermined temperature.

A cover member 22, made of a ceramics such as alumina or the like, is provided in the substrate stage 2 so as to cover an outer peripheral region of the substrate mounting surface and a side surface of the substrate stage 2.

The support member 23 extends downwards from the center of a lower surface of the substrate stage 2 via a through-hole formed in a bottom wall of the processing container 1. A lower end of the support member 23 is connected to an elevating mechanism 24. The substrate stage 2 is configured to be movable up and down between a process position as illustrated in FIG. 2 and a transfer position as indicated by a dashed double-dotted line below the process position through the support member 23 by the elevating mechanism 24. The substrate W can be transferred at the transfer position. Further, a flange 25 is disposed in a lower portion of the support member 23 below the processing container 1. A bellows 26 is provided between the bottom surface of the processing container 1 and the flange 25 so as to isolate an internal atmosphere of the processing container 1 from ambient air and to be flexible with the vertical movement of the substrate stage 2.

Three substrate support pins 27 (only two are shown in FIG. 2) are provided near the bottom surface of the processing container 1 to protrude upwards from an elevating plate 27a. The substrate support pins 27 can be moved up or down through the elevating plate 27a by an elevating mechanism 28 provided below the processing container 1. The substrate support pins 27 can be inserted into respective through-holes 2a formed in the substrate stage 2 when the substrate stage 2 is positioned at the transfer position, and can be moved up and down on an upper surface of the substrate stage 2. By moving up and down the substrate support pins 27 in this manner, the substrate W is transferred between a substrate transfer mechanism (not shown) and the substrate stage 2.

The shower head 3 supplies the processing gas into the processing container 1 in the form of a shower. The shower head 3 is made of metal and is provided to face the substrate stage 2. The shower head 3 has a diameter substantially equal to that of the substrate stage 2. The shower head 3 includes a main body 31 fixed to the ceiling wall 14 of the processing container 1, and a shower plate 32 connected to a lower side of the main body 31. A gas diffusion space 33 is formed between the main body 31 and the shower plate 32. A gas introduction hole 36 is formed to penetrate through the center of the main body 31 and the center of the ceiling wall 14 of the processing container 1, and is in communication with the gas diffusion space 33. The shower plate 32 has an annular protruded portion 34 protruding downwards from a peripheral edge portion of the shower plate 32. Gas discharge holes 35 are formed in a flat surface of the shower plate 32 inward of the annular protruded portion 34.

When the substrate stage 2 is located at the process position, a process space 37 is formed between the shower plate 32 and the substrate stage 2. The annular protruded portion 34 and an upper surface of the cover member 22 of the substrate stage 2 approach each other to form an annular gap 38.

The exhaust part 4 exhausts the interior of the processing container 1. The exhaust part 4 includes an exhaust pipe 41 connected to the exhaust port 13b of the exhaust duct 13, and an exhaust mechanism 42 connected to the exhaust pipe 41 and having a vacuum pump, a pressure control valve, and the like. At the time of processing, the gas inside the processing container 1 reaches the exhaust duct 13 through the slit 13a, and is then discharged from the exhaust duct 13 through the exhaust pipe 41 by the exhaust mechanism 42 of the exhaust part 4.

The processing gas supply mechanism 5 includes a raw material gas supply line L1, a hydrogen-containing gas supply line L2, a first continuous $N_2$ gas supply line L3, a second continuous $N_2$ gas supply line L4, a first flash purge line L5, a second flash purge line L6, and a continuous hydrogen-containing gas supply line L7.

The raw material gas supply line L1 extends from a raw material gas source GS1, which is a source of a metal-containing gas, for example, a $WCl_6$ gas, and is connected to a junction pipe L8. The junction pipe L8 is connected to the gas introduction hole 36. A mass flow controller M1, a buffer tank T1, and an on-off valve V1 are provided in the raw material gas supply line L1 in the named order from the raw material gas source GS1. The mass flow controller M1 controls a flow rate of the $WCl_6$ gas flowing through the raw material gas supply line L1. The buffer tank T1 temporarily stores the $WCl_6$ gas, and supplies the $WCl_6$ gas at a required flow rate in a short period of time. The on-off valve V1 switches the supply and cutoff of the $WCl_6$ gas during an atomic layer deposition (ALD) process. Further, $WCl_6$ is solid at room temperature. $WCl_6$, which is tungsten chloride remaining in a solid state, is received in a film-forming raw material tank (not shown). A heater is provided around the film-forming raw material tank so as to heat $WCl_6$ in the film-forming raw material tank to an appropriate temperature. Thus, $WCl_6$ is sublimated and flows toward a downstream side of the raw material gas source GS1.

The hydrogen-containing gas supply line L2 extends from a hydrogen-containing gas source GS2, which is a source of a hydrogen-containing gas, for example, a $H_2$ gas, and is connected to the junction pipe L8. A mass flow controller M2, a buffer tank T2, and an on-off valve V2 are provided in the hydrogen-containing gas supply line L2 in the named order from the hydrogen-containing gas source GS2. The mass flow controller M2 controls a flow rate of the $H_2$ gas flowing through the hydrogen-containing gas supply line L2. The buffer tank T2 temporarily stores the $H_2$ gas and supplies the $H_2$ gas at a required flow rate in a short period of time. The on-off valve V2 switches the supply and cutoff of the $H_2$ gas during the ALD-based process.

The first continuous $N_2$ gas supply line L3 extends from an $N_2$ gas source GS3 as a source of a $N_2$ gas, and is connected to the raw material gas supply line L1. Thus, the $N_2$ gas is supplied to the raw material gas supply line L1 through the first continuous $N_2$ gas supply line L3. The first continuous $N_2$ gas supply line L3 continuously supplies the $N_2$ gas during film formation based on ALD. The $N_2$ gas functions as a carrier gas for the $WCl_6$ gas and also functions as a purge gas. A mass flow controller M3, an on-off valve V3, and an orifice F3 are provided in the first continuous $N_2$ gas supply line L3 in the named order from the $N_2$ gas source GS3. The mass flow controller M3 controls a flow rate of the $N_2$ gas flowing through the first continuous $N_2$ gas supply line L3. The orifice F3 suppresses a gas supplied at a relatively high flow rate from the buffer tank T1 or T5, from flowing backwards to the first continuous $N_2$ gas supply line L3.

The second continuous $N_2$ gas supply line L4 extends from an $N_2$ gas source GS4 as a source of a N2 gas, and is connected to the hydrogen-containing gas supply line L2. Thus, the $N_2$ gas is supplied to the hydrogen-containing gas supply line L2 through the second continuous $N_2$ gas supply line L4. The second continuous $N_2$ gas supply line L4 continuously supplies the $N_2$ gas during the ALD-based film formation. The $N_2$ gas functions as a carrier gas for the $H_2$ gas and also functions as a purge gas. A mass flow controller M4, an on-off valve V4, and an orifice F4 are provided in the second continuous $N_2$ gas supply line L4 in the named order from the $N_2$ gas source GS4. The mass flow controller M4 controls a flow rate of the $N_2$ gas flowing through the second continuous $N_2$ gas supply line L4. The orifice F4 suppresses a gas supplied at a relatively high flow rate from the buffer tank T2 or T6, from flowing backwards to the second continuous $N_2$ gas supply line L4.

The first flash purge line L5 extends from an $N_2$ gas source GS5 as a source of a $N_2$ gas, and is connected to the first continuous $N_2$ gas supply line L3. Thus, the $N_2$ gas is supplied to the raw material gas supply line L1 through the first flash purge line L5 and the first continuous $N_2$ gas supply line L3. The first flash purge line L5 supplies the $N_2$ gas only in a purge step in ALD-based film formation. A mass flow controller M5, a buffer tank T5, and an on-off valve V5 are provided in the first flash purge line L5 in the named order from the $N_2$ gas source GS5. The mass flow controller M5 controls a flow rate of the $N_2$ gas flowing through the first flash purge line L5. The buffer tank T5 temporarily stores the $N_2$ gas and supplies the $N_2$ gas at a required flow rate in a short period of time. The on-off valve V5 switches the supply and cutoff of the $N_2$ gas during purging in the ALD-based process.

The second flash purge line L6 extends from an $N_2$ gas source GS6 as a source of a $N_2$ gas, and is connected to the second continuous $N_2$ gas supply line L4. Thus, the $N_2$ gas is supplied to the hydrogen-containing gas supply line L2 through the second flash purge line L6 and the second continuous $N_2$ gas supply line L4. The second flash purge line L6 supplies the $N_2$ gas only in a purge step in the ALD-based film formation. A mass flow controller M6, a buffer tank T6, and an on-off valve V6 are provided in the second flash purge line L6 in the named order from the $N_2$ gas source GS6. The mass flow controller M6 controls a flow rate of the $N_2$ gas flowing through the second flash purge line L6. The buffer tank T6 temporarily stores the $N_2$ gas and supplies the N$_2$ gas at a required flow rate in a short period of time. The on-off valve V6 switches the supply and cutoff of the N$_2$ gas during purging in the ALD-based process.

The continuous hydrogen-containing gas supply line L7 extends from a hydrogen-containing gas source GS7, which is a source of a hydrogen-containing gas, for example, a H$_2$ gas, and is connected to the hydrogen-containing gas supply line L2. Thus, the H$_2$ gas is supplied to the hydrogen-containing gas supply line L2 through the continuous hydrogen-containing gas supply line L7. The continuous hydrogen-containing gas supply line L7 continuously supplies the H$_2$ gas during the ALD-based film formation. A mass flow controller M7 and an on-off valve V7 are provided in the continuous hydrogen-containing gas supply line L7 in the named order from the hydrogen-containing gas source GS7. The mass flow controller M7 controls a flow rate of the H$_2$ gas flowing through the continuous hydrogen-containing gas supply line L7.

The control device 6 controls the operation of each part of the metal film forming apparatus 200. The control device 6 includes a central processing unit (CPU), a read-only memory (ROM), and a random access memory (RAM). The CPU executes desired processes according to a recipe stored in a memory region such as RAM. Apparatus control information corresponding to process conditions is set in the recipe. The control information may include a gas flow rate, pressure, temperature, and process time. Further, the recipe and a program used by the control device 6 may be stored in, for example, a hard disk or semiconductor memory. Further, the recipe and the like may be set in a predetermined position and may be read out therefrom in a state in which the recipe and the like are received in a portable non-transitory computer-readable memory medium, such as a CD-ROM, a DVD, or the like.

<Film Forming Method performed by Cluster System 300>

Figure 3:
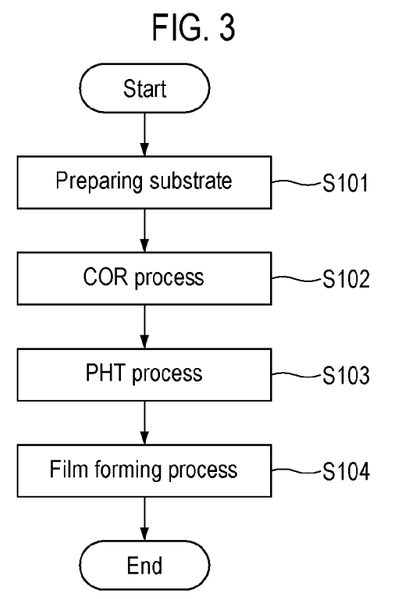
FIG. 3 is a flowchart illustrating an example of an operation of the cluster system according to the embodiment.

A film forming method performed by the cluster system 300 according to the embodiment will be described with reference to FIGS. 3 to 5. FIG. 3 is a flowchart illustrating one example of the film forming method performed by the cluster system 300 according to the embodiment. FIGS. 4A to 4D are schematic cross-sectional views illustrating the state of the substrate W in each step.

Figure 4A:
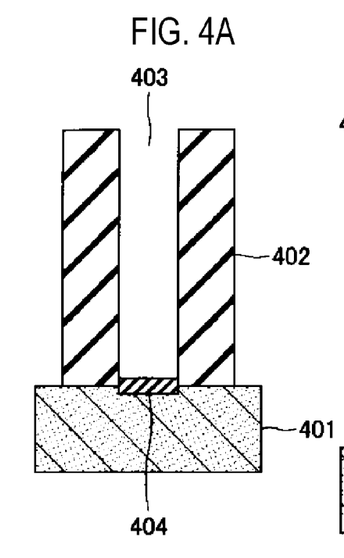
FIGS. 4A to 4D are schematic cross-sectional views illustrating a state of a substrate in each step of the embodiment, respectively.

In step S101, the substrate W is prepared. As illustrated in FIG. 4A, in the substrate W, an insulation film 402 is formed on a silicon base 401, and a trench 403 is formed in a predetermined pattern in the insulation film 402. A natural oxide film 404 is formed on a silicon portion in the bottom of the trench 403. Further, the insulation film 402 is mainly formed of a SiO$_2$ film, but a portion of the insulation film 402 may be made of a SiN film. The substrate W is received in, for example, a carrier C having an air atmosphere. The substrate W is transferred from the carrier C to the first pre-processing apparatus 100 via the atmospheric-side transfer chamber 303, the load-lock chamber 302, and the vacuum transfer chamber 301 by the transfer mechanisms 306 and 308.

In step S102, the overall control part 310 performs the COR process which is one example of chemical etching. Further, the chemical etching is performed by a reactive gas without using plasma, and is isotropic etching. Therefore, the chemical etching can remove the natural oxide film 404 from the bottom of the trench 403 which may have a complicated shape. The COR process using a NH$_3$ gas and a HF gas as chemical gases is suitable for the chemical etching.

Figure 4B:
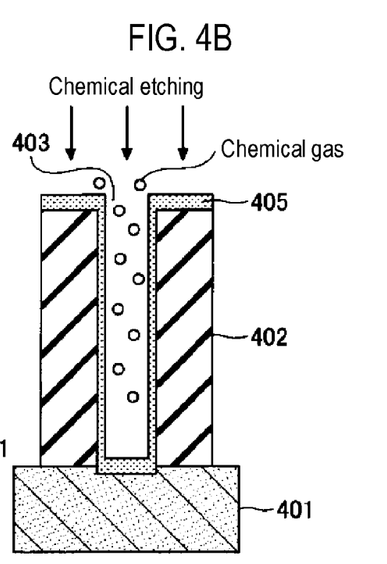

As illustrated in FIG. 4B, after the COR process, a reaction product 405 containing mainly ammonium fluorosilicate (($NH_4$)$_2$SiF$_6$: AFS) by reaction between the NH$_3$ gas and the HF gas is formed on an upper surface of the insulation film 402 and the bottom of the trench 403.

After the COR process, the substrate W is transferred from the first pre-processing apparatus 100 to the second pre-processing apparatus 150 via the vacuum transfer chamber 301 by the transfer mechanism 306.

Figure 4C:
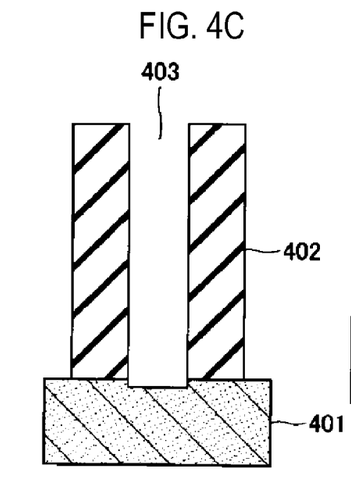

In step S103, the overall control part 310 executes the PHT process. The PHT process is a process of sublimating and removing the reaction product 405 generated by the COR process in step S102. Specifically, the reaction product 405 is treated in a nitrogen atmosphere for a specific period of time at a temperature at which the reaction product 405 is sublimated, so that the reaction product 405 is removed from the substrate W by sublimation. Thus, as illustrated in FIG. 4C, the natural oxide film 404 (see FIG. 4A) in the bottom of the trench 403 is removed.

After the PHT process, the substrate W is transferred from the second pre-processing apparatus 150 to the metal film forming apparatus 200 via the vacuum transfer chamber 301 by the transfer mechanism 306.

In step S104, the overall control part 310 executes a film forming process of forming a tungsten film 406. As expressed by the reaction formula below, a decomposition reaction of a raw material WCl$_x$ by a Si reduction reaction occurs on a silicon layer in the bottom of the trench 403, from which the natural oxide film has been removed. In the raw material WCl$_x$, x is set to 3 to 6. For example, if x is 6, the reaction formula is as follows.

Further, in a case where the natural oxide film is removed using a fluorine-containing gas, the Si surface is terminated with fluorine so that a Si—F bond is formed in the front surface of the substrate. When a metal raw material including Cl, such as WCl or the like, is supplied onto the front surface of the substrate, the fluorine is desorbed from the fluorine-terminated Si surface and the halogen element of the metal material is substituted with the fluorine so that the fluorine is removed. By desorbing the fluorine, a site onto which the raw material can be adsorbed is formed on the Si surface. Thus, a metal film can be directly grown on the Si surface. Such a reaction on the fluorine-terminated surface is not limited to the case of WCl$_x$, but may be achieved using a metal material formed by a combination of a metal atom such as Ta, Co, Ni, Mo, Hf, Zr or the like and a halogen element such as Cl, Br, I or the like. The fluorine (F) termination resulting from the COR process based on the HF gas and the NH$_3$ gas has been described as the pre-processing for the Si surface, but is not limited thereto. For example, the pre-processing may be a hydrogen (H) termination, a Cl (halogen) termination, or a null (Si) termination as long as the natural oxide film can be removed.

Figure 4D:
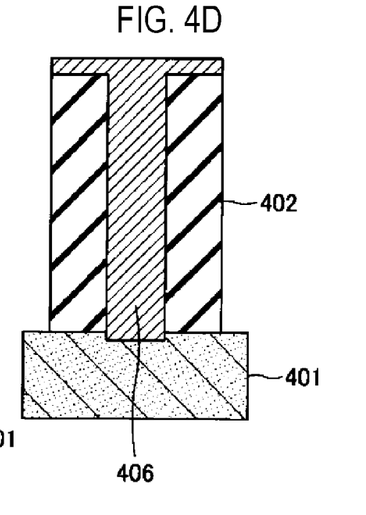

Thus, as illustrated in FIG. 4D, it is possible to directly embed the tungsten film 406, starting from the silicon layer in the bottom of the trench 403.

The film forming process performed by the metal film forming apparatus 200 will be described by taking, as an example, a case where a tungsten film is formed on the substrate W through the ALD-based process. FIG. 5 illustrates an example of a gas supply sequence in the ALD-based process. Further, in FIG. 5, black arrows indicate the supply of gas into the process space 37, and white arrows indicate the filling of the buffer tanks with gas.

First, the substrate W is loaded into the processing container 1. Specifically, the gate valve 12 is opened in the state in which the substrate stage 2 is lowered to the transfer position. Subsequently, the substrate W is loaded into the processing container 1 by a transfer arm (not shown) through the loading/unloading port 11, and is mounted on the substrate stage 2 which has been heated to a predetermined temperature (for example, 300 to 600 degrees C.) by the heater 21. Subsequently, the substrate stage 2 is moved up to the process position and an internal pressure of the processing container 1 is depressurized to a predetermined degree of vacuum. Then, the on-off valves V3 and V4 are opened, and the on-off valves V1, V2, V5, V6, and V7 are closed. Thus, the $N_2$ gas is supplied from the $N_2$ gas sources GS3 and GS4 into the processing container 1 via the first continuous $N_2$ gas supply line L3 and the second continuous $N_2$ gas supply line L4 so that the internal pressure of the processing container 1 is increased and the temperature of the substrate W on the substrate stage 2 is stabilized. At this time, the $WCl_6$ gas is supplied into the buffer tank T1 from the raw material gas source GS1, so that an internal pressure of the buffer tank T1 is maintained to be substantially constant. Further, the $N_2$ gas is supplied into the buffer tanks T5 and T6 from the gas sources G5 and G6, respectively, so that an internal pressure of each of the buffer tanks T5 and T6 are maintained to be substrate constant.

Subsequently, the tungsten film is formed by the ALD-based process using the $WCl_6$ gas and the $H_2$ gas.

Figure 5:
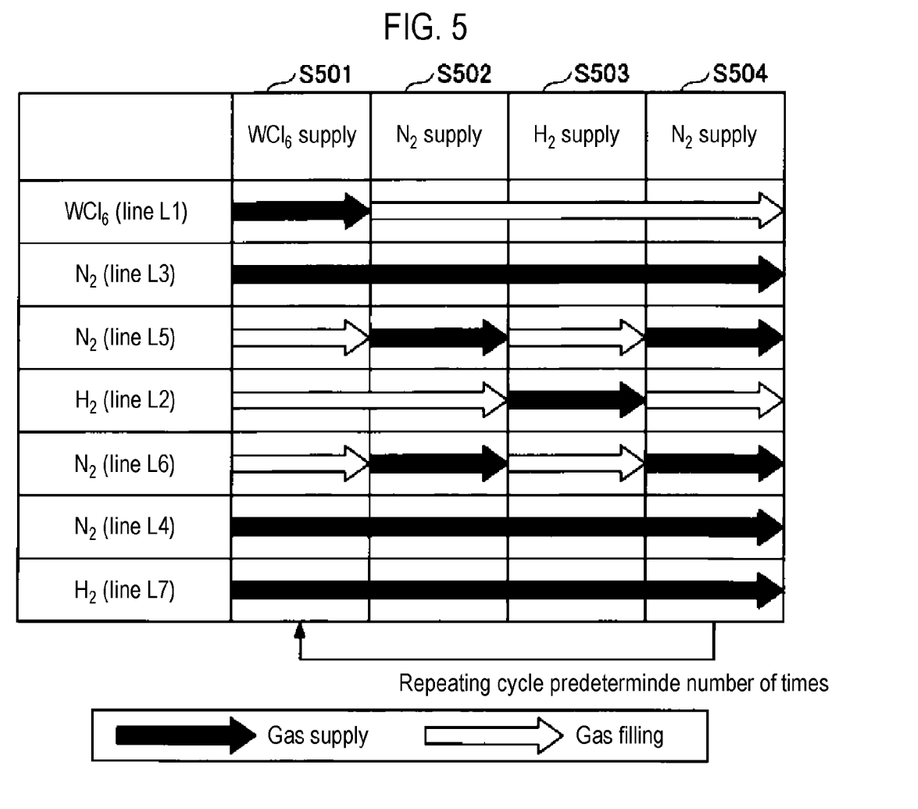
FIG. 5 is a view illustrating an example of a gas supply sequence in an ALD-based process.

The ALD-based process illustrated in FIG. 5 is a process of supplying the $WCl_6$ gas and the $H_2$ gas in an alternate manner by repeating a cycle including a $WCl_6$ gas supply step S501, an a $N_2$ gas supply step S502, an a $H_2$ gas supply step S503, and a $N_2$ gas supply step S504 a predetermined number of times, and forming the tungsten film having a desired thickness on the substrate W. In FIG. 5, only one cycle is shown.

The $WCl_6$ gas supply step S501 is a step of supplying the $WCl_6$ gas into the process space 37. In the $WCl_6$ gas supply step S501, first, in the state in which the on-off valves V3 and V4 remain opened, the $N_2$ gas (continuous $N_2$ gas) is continuously supplied from the $N_2$ gas sources GS3 and GS4 via the first continuous $N_2$ gas supply line L3 and the second continuous $N_2$ gas supply line L4. Further, the on-off valve V1 is opened and the $WCl_6$ gas is supplied from the raw material gas source GS1 into the process space 37 of the processing container 1 via the raw material gas supply line L1. At this time, the $WCl_6$ gas is temporarily stored in the buffer tank T1, and is then supplied into the processing container 1. Further, the on-off valve V7 is opened to supply the $H_2$ gas into the process space 37. In the $WCl_6$ gas supply step S501, a reduction gas is supplied together with the $WCl_6$ gas to activate the supplied $WCl_6$ gas. Thus, film formation reaction is likely to occur in the $H_2$ gas supply step S503 following the $WCl_6$ gas supply step S501. Thus, it is possible to increase a film formation rate by increasing a deposited film thickness per one cycle while maintaining high step coverage. A flow rate of the reduction gas used as an additional gas may be set to such an extent that a CVD reaction does not occur in the $WCl_6$ gas supply step S501.

The $N_2$ gas supply step S502 is a step of purging surplus $WCl_6$ gas or the like remaining in the process space 37. In the $N_2$ gas supply step S502, in the state in which the $N_2$ gas (continuous $N_2$ gas) is continuously supplied through the first continuous $N_2$ gas supply line L3 and the second continuous $N_2$ gas supply line L4, the on-off valve V1 is closed to stop the supply of the $WCl_6$ gas. Further, the on-off valves V5 and V6 are opened. Thus, the $N_2$ gas is supplied from each of the $N_2$ gas sources GS5 and GS6 into the process space 37 of the processing container 1 via the first flash purge line L5 and the second flash purge line L6. At this time, since the $N_2$ gas is temporarily stored in each of the buffer tanks T5 and T6 and is then supplied into the processing container 1, the $N_2$ gas can be supplied at a relative high flow rate. In this manner, the surplus $WCl_6$ gas or the like remaining in the process space 37 are purged.

The $H_2$ gas supply step S503 is a step of supplying the $H_2$ gas into the process space 37. In the $H_2$ gas supply step S503, the on-off valve V2 is opened in the state in which the $N_2$ gas (continuous $N_2$ gas) is continuously supplied through the first continuous $N_2$ gas supply line L3 and the second continuous $N_2$ gas supply line L4. Thus, the $H_2$ gas is supplied from the hydrogen-containing gas source GS2 into the process space 37 via the hydrogen-containing gas supply line L2. At this time, the $H_2$ gas is temporarily stored in the buffer tank T2 and is then supplied into the processing container 1. $WCl_6$ adsorbed onto the substrate W is reduced in the $H_2$ gas supply step S503. A flow rate of the $H_2$ gas used at that time may be set to such an extent that sufficient reduction reaction occurs. Further, a flow rate of the $H_2$ gas supplied into the process space 37 through the continuous hydrogen-containing gas supply line L7 is smaller than that of the $H_2$ gas supplied into the process space 37 through the hydrogen-containing gas supply line L2.

The $N_2$ gas supply step S504 is a step of purging surplus $H_2$ gas remaining in the process space 37. In the $N_2$ gas supply step S504, in the state in which the $N_2$ gas (continuous $N_2$ gas) is continuously supplied through the first continuous $N_2$ gas supply line L3 and the second continuous $N_2$ gas supply line L4, the on-off valve V2 is closed to stop the supply of the $H_2$ gas. Further, the on-off valves V5 and V6 are opened. Thus, the $N_2$ gas is supplied from each of the $N_2$ gas sources GS5 and GS6 into the process space 37 of the processing container 1 via the first flash purge line L5 and the second flash purge line L6, respectively. At this time, since the $N_2$ gas is temporarily stored in each of the buffer tanks T5 and T6 and is then supplied into the processing container 1, the $N_2$ gas may be supplied at a relatively high flow rate. In this manner, the surplus $H_2$ gas or the like remaining in the process space 37 are purged.

By repeating the aforementioned cycle, it is possible to embed tungsten in the trench 403.

One example of the process conditions used in the film forming process of the metal film forming apparatus 200 is as follows. Herein, numerical values shown in each parenthesis indicate preferable condition ranges.

Substrate temperature: 480 degrees C. (300 to 600 degrees C.)
Line L1 $WCl_6$: 4.5 sccm (1 to 30 sccm)
Line L2 $H_2$: 5,000 sccm (1,000 to 15,000 sccm)
Line L7 $H_2$: 100 sccm (1 to 500 sccm)
Lines L5, L6 $N_2$: 2,000 sccm (500 to 5,000 sccm)
Lines L3, L4 $N_2$: 800 sccm (100 to 5,000 sccm)
Internal pressure of process space: 45 Torr (10 to 100 Torr)
Supply time of $WCl_6$ [S501]/Purge time with $N_2$ [S502]/Supply time of $H_2$ [S503]/Purge time with $N_2$ [S504]: 0.3 seconds/0.2 seconds/0.3 seconds/0.2 seconds (each step: 0.01 to 1 seconds)
Number of repetitions: 50 times (which changes depending on a film thickness (for example, 1 to 300 times in the case of about 70 Å))

The present inventors have found that the film forming process of the metal film forming apparatus 200 is dependent on temperature.

The present inventors have found that the tungsten film was not formed on the substrate W when the temperature of the substrate W is set to a first temperature (e.g. 460 degrees C.), and that the tungsten film was formed on the substrate W when the temperature of the substrate W is set to a second temperature (e.g. 480 degrees C.) higher than the first temperature. Further, the present inventors have found that the thickness of the tungsten film formed on the substrate W was increased when the temperature of the substrate W is set to a third temperature (e.g. 500 degrees C.) higher than the second temperature. That is, it was found that the formation of the tungsten film can be controlled by controlling the temperature of the substrate W.

Figure 6A:
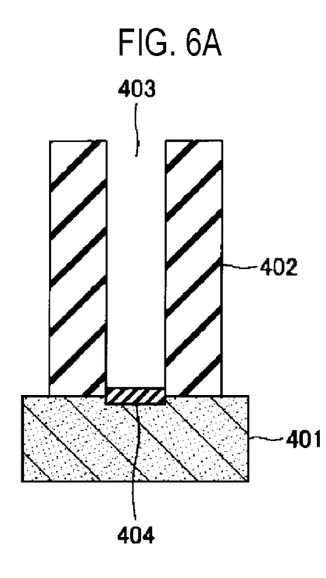
FIGS. 6A to 6C are schematic cross-sectional views illustrating a state of a substrate in each step of a reference example, respectively.
Figure 6B:
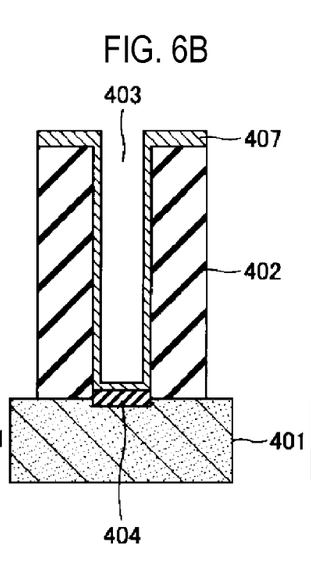
Figure 6C:
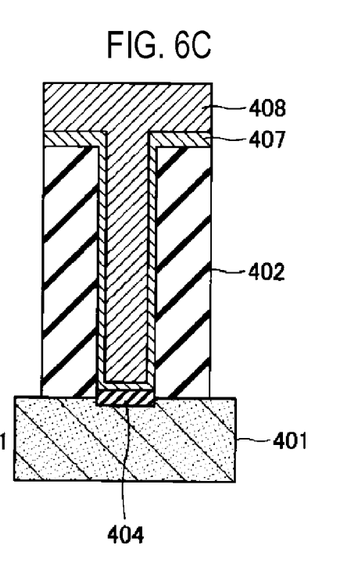

Hereinafter, a description will be made as to a cluster system according to a reference example. The cluster system (see FIG. 1) according to the embodiment includes the first pre-processing apparatus (the COR process) and the second pre-processing apparatus (the PHT process) which perform the pre-processing, whereas the cluster system according to the reference example includes a underlying film forming apparatus which forms a TiN film as a underlying film and a metal film forming apparatus which forms a tungsten film on the underlying film. FIGS. 6A to 6C are schematic cross-sectional views illustrating the states of the substrate W in each step of a film forming method performed by the cluster system according to the reference example.

First, as illustrated in FIG. 6A, the substrate W is prepared. Subsequently, as illustrated in FIG. 6B, the underlying film forming apparatus forms a TiN film as a underlying film 407 in conformity to a recessed portion. Thereafter, as illustrated in FIG. 6C, the metal film forming apparatus forms a tungsten film 408 on the TiN film. Further, the method of forming the tungsten film 408 is similar to the tungsten film forming method according to the embodiment.

Hereinafter, in comparison to the film forming method of the cluster system according to the reference example, the film forming method of the cluster system according to the embodiment will be described.

The film forming method of the cluster system according to the embodiment may not require the underlying film forming apparatus which is required for the cluster system according to the reference example.

Further, in a case where a pre-processing time required in the first pre-processing apparatus 100 and the second pre-processing apparatus 150 is shorter than that required for forming the underlying film (the TiN film) by the underlying film forming apparatus, the film forming method of the cluster system according to the embodiment can enhance throughput.

Figure 7:
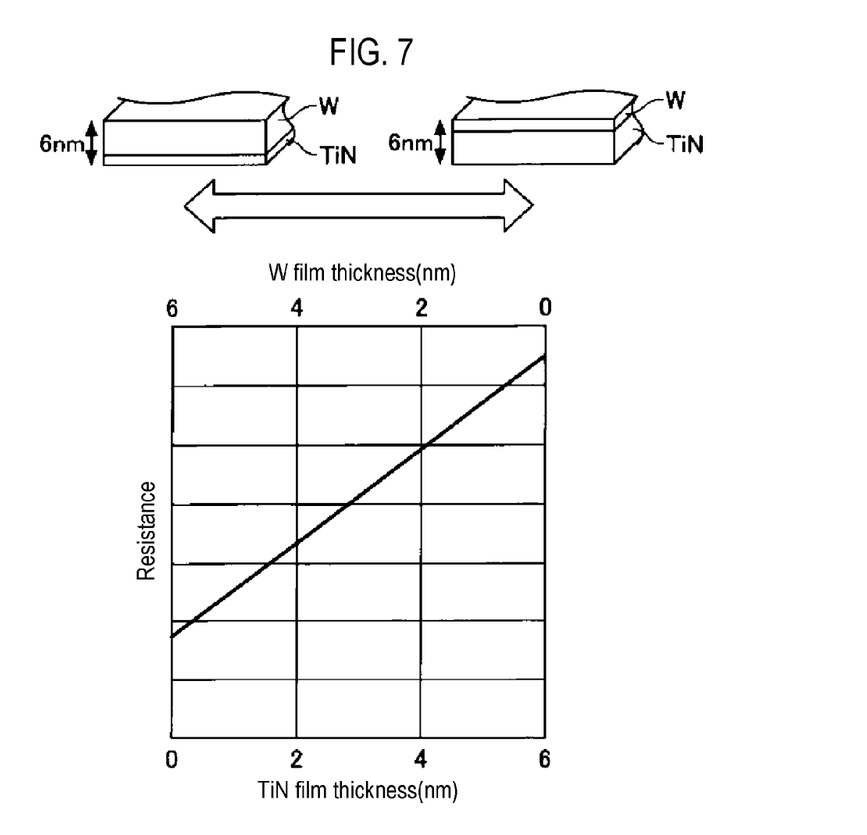
FIG. 7 is a graph illustrating a relationship between a underlying film and a tungsten film in resistance and thickness in the reference example.

FIG. 7 is a graph illustrating a relationship between resistance and thickness of the underlying film 407 and the tungsten film 408 in the reference example. As illustrated in FIG. 7, assuming that the sum of the thickness of the underlying film 407 and the thickness of the tungsten film 408 is constant (6 Nm in this example), resistance is reduced as the underlying film 407 becomes thinner. On the other hand, since the underlying film 407 is not required in this embodiment, the resistance can be smaller than that in the reference example.

Further, in the reference example, the coverage of the tungsten film 408 depends on the state of the underlying film 407. On the other hand, since the underlying film 407 is not required in this embodiment, the coverage can be increased compared with the reference example.

In the reference example, a wafer in-plane uniformity of the tungsten film 408 depends on the state of the underlying film 407. On the other hand, since the underlying film 407 is not required in this embodiment, the wafer in-plane uniformity of the tungsten film 408 can be increased compared with the reference example.

Further, in the reference example, when the underlying film 407 is entirely etched by a raw material gas (WCl6) for forming the tungsten film 408 during the formation of the tungsten film 408, the tungsten film 408 cannot be formed. On the other hand, according to the embodiment, the tungsten film 406 can be formed without having to use the underlying film 407.

Figure 8:
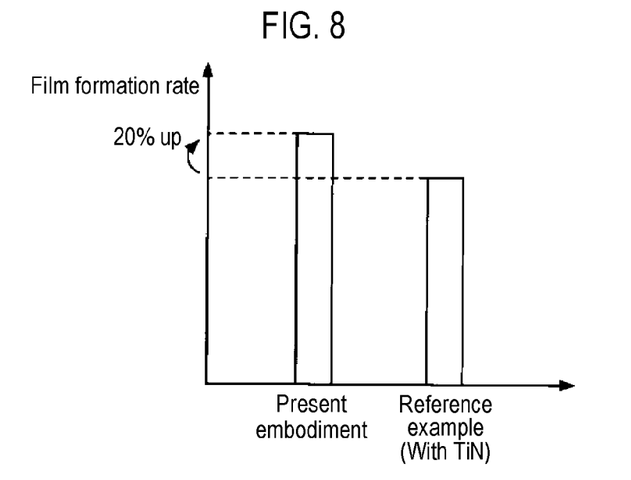
FIG. 8 is a graph illustrating the result of the comparison of a film formation rate of this embodiment with that of the reference example.

FIG. 8 is a graph representing a comparison result between the film formation rate of the embodiment and that of the reference example. As illustrated in FIG. 8, the film formation rate of the embodiment was 20% higher than the film formation rate of the reference example. Thus, the film forming method of the cluster system of the embodiment can improve throughput.

Further, in the reference example, the tungsten film 408 is formed starting from a side surface and a bottom surface of the trench 403 in which the underlying film 407 is formed. On the other hand, in the film forming method of the cluster system according to the embodiment, the tungsten film 406 is not formed on SiO2. Thus, the tungsten film 406 is formed starting from the bottom surface of the trench 403. Thus, in the embodiment, the tungsten film 406 can be selectively formed from the bottom surface of the trench 403.

The embodiment of the cluster system 300 has been described in the above. The present disclosure is not limited to the above embodiment, but various modifications and improvements are possible without departing from the subject matter of the present disclosure, which is set forth in the claims.

As illustrated in FIGS. 2 and 5, the metal film forming apparatus 200 has been described as an ALD-based apparatus which forms the tungsten film through the ALD-based process, but is not limited thereto and may be a CVD-based apparatus.

The raw material gas has been described as $WCl_6$, but is not limited thereto and may be tungsten chloride, such as $WCl_5$, $WCl_4$, or $WCl_3$. The reduction gas has been described as $H_2$, but is not limited thereto.

The film forming system according to the embodiment has been described as the cluster system 300 including multiple chambers, but is not limited thereto, and may be a film forming system capable of performing the pre-processing and the film forming process in a single chamber. Further, the first pre-processing apparatus 100 for performing the COR process and the second pre-processing apparatus 150 for performing the PHT process have been described to be different from each other. However, the present disclosure is not limited thereto. The COR process and the PHT process may be performed in the same processing apparatus.

According to one aspect, it is possible to provide a substrate processing method and a film forming system which form a low-resistance tungsten film.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of processing a substrate, the method comprising:

providing the substrate on which a natural oxide film is formed;

performing a pre-processing on the substrate such that the natural oxide film formed on the substrate is removed; and directly forming a metal film on the substrate by heating a stage on which the substrate is mounted to a predetermined temperature and supplying a metal halide gas comprising a combination of a metal atom from a group of Ta, Co, Ni, Mo, Hf, and Zr and a halogen element from a group of Cl, Br, and I, and a reduction gas to the substrate which has been subjected to the pre-processing, wherein the performing the pre-processing includes:
exposing, in a first pre-processing step, the substrate to a mixture gas forming a hydrogen termination, halogen termination, or null termination on a surface of the substrate where the natural oxide film is removed; and removing a reaction product generated from a reaction of the natural oxide film and the mixture gas, and deposited on the substrate, by heating the substrate to sublimate the reaction product from the substrate in a second pre-processing step, wherein the forming the metal film includes alternately:
supplying the metal halide gas together with the reduction gas; and
supplying the reduction gas without supplying the metal halide gas, wherein the substrate comprises the surface with the halogen termination, and wherein the forming the metal film further includes forming a site for the metal atom to be adsorbed on the surface from which the halogen element from the halogen termination is desorbed.

2. The method of claim 1, wherein the forming the metal film includes controlling a temperature of the stage and selectively forming the metal film on the substrate.

3. The method of claim 1, wherein the first pre-processing step is an etching process of removing the natural oxide film by an etching.

4. The method of claim 3, wherein the etching process is a plasma-free etching process.

5. The method of claim 4, wherein the reduction gas is a hydrogen-containing gas.

6. The method of claim 5, wherein the hydrogen-containing gas is $H_2$.

7. The method of claim 6, wherein the performing the pre-processing and the forming the metal film are carried out without being exposed to an atmosphere.

8. The method of claim 7, wherein a temperature of the substrate in the forming the metal film falls within a range of 300 to 600 degrees C.

9. The method of claim 1, wherein the reduction gas is a hydrogen-containing gas.

10. The method of claim 1, wherein the performing the pre-processing and the forming the metal film are carried out without being exposed to an atmosphere.

11. The method of claim 1, wherein the mixture gas comprises a fluorine containing gas, and wherein the exposing the substrate to the mixture gas includes forming a fluorine termination on the surface of the substrate where the natural oxide film is removed by using the mixture gas.

12. A film forming system comprising:
at least one processing apparatus; and
a controller,
wherein the controller is configured to control the at least one processing apparatus to perform:
providing a substrate on which a natural oxide film is formed;
performing a pre-processing on the substrate such that the natural oxide film formed on the substrate is removed; and
directly forming a metal film on the substrate by heating a stage on which the substrate is mounted to a predetermined temperature and supplying a metal halide gas comprising a combination of a metal atom from a group of Ta, Co, Ni, Mo, Hf, and Zr and a halogen element from a group of Cl, Br, and I, and a reduction gas to the substrate which has been subjected to the pre-processing, wherein the performing the pre-processing includes:
exposing, in a first pre-processing step, the substrate to a mixture gas forming a hydrogen termination, halogen termination, or null termination on a surface of the substrate where the natural oxide film is removed; and removing a reaction product generated from a reaction of the natural oxide film and the mixture gas, and deposited on the substrate, by heating the substrate to sublimate the reaction product from the substrate in a second pre-processing step, wherein the forming the metal film includes alternately:
supplying the metal halide gas together with the reduction gas; and
supplying the reduction gas without supplying the metal halide gas, wherein the substrate comprises the surface with the halogen termination, and wherein the forming the metal film further includes forming a site for the metal atom to be adsorbed on the surface from which the halogen element from the halogen termination is desorbed.

13. The system of claim 12, wherein the first pre-processing step is performed by a first processing apparatus, and the second pre-processing step is performed by a second processing apparatus.

14. The system of claim 13, wherein the performing the pre-processing and the forming the metal film are carried out without breaking a vacuum state.

15. The system of claim 12, wherein the first pre-processing step and the second pre-processing step are performed by the same processing apparatus.

16. The system of claim 12, wherein the mixture gas comprises a fluorine containing gas, and wherein the exposing the substrate to the mixture gas includes forming a fluorine termination on the surface of the substrate where the natural oxide film is removed by using the mixture gas.

* * * * *